(12) United States Patent
Tsai et al.

(10) Patent No.: US 10,438,838 B2
(45) Date of Patent: Oct. 8, 2019

(54) SEMICONDUCTOR STRUCTURE AND RELATED METHOD

(71) Applicant: Taiwan Semiconductor Manufacturing Co., Ltd., Hsinchu (TW)

(72) Inventors: Yu-Hsiang Tsai, Hsinchu (TW); Chung-Chuan Tseng, Hsinchu (TW); Li Hsin Chu, New Taipei (TW); Chia-Wei Liu, Hsinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/621,563

(22) Filed: Jun. 13, 2017

(65) Prior Publication Data

US 2018/0061698 A1    Mar. 1, 2018

Related U.S. Application Data

(60) Provisional application No. 62/382,587, filed on Sep. 1, 2016.

(51) Int. Cl.
| | |
|---|---|
| H01L 21/76 | (2006.01) |
| H01L 29/06 | (2006.01) |
| H01L 21/78 | (2006.01) |
| H01L 21/762 | (2006.01) |
| H01L 21/84 | (2006.01) |
| H01L 21/02 | (2006.01) |

(52) U.S. Cl.
CPC .. *H01L 21/76254* (2013.01); *H01L 21/02002* (2013.01); *H01L 21/78* (2013.01); *H01L 21/84* (2013.01); *H01L 29/0649* (2013.01)

(58) Field of Classification Search
CPC .................................................. H01L 21/76251
See application file for complete search history.

(56) References Cited

U.S. PATENT DOCUMENTS

| | | | |
|---|---|---|---|
| 6,080,640 A * | 6/2000 | Gardner | H01L 21/76801 257/E21.576 |
| 6,444,493 B1 * | 9/2002 | Feil | H01L 24/94 257/E21.705 |
| 6,911,379 B2 | 9/2005 | Yeo et al. | |
| 7,368,334 B2 | 5/2008 | Yeo et al. | |
| 7,372,107 B2 | 5/2008 | Yeo et al. | |
| 7,838,392 B2 | 11/2010 | Langdo et al. | |
| 9,269,591 B2 | 2/2016 | Kalnitsky et al. | |
| 9,548,236 B2 | 1/2017 | Langdo et al. | |
| 9,601,623 B2 | 3/2017 | Lochtefeld et al. | |

(Continued)

*Primary Examiner* — Moazzam Hossain
*Assistant Examiner* — Omar F Mojaddedi
(74) *Attorney, Agent, or Firm* — Haynes and Boone, LLP

(57) ABSTRACT

A method and structure for providing a semiconductor-on-insulator (SCOI) wafer having a buried low-K dielectric layer includes forming a device layer on a first semiconductor substrate. In various embodiments, at least a portion of the device layer is separated from the first semiconductor substrate, where the separating forms a cleaved surface on the separated portion of the device layer. In some examples, a patterned low-K dielectric layer is formed on a second semiconductor substrate. Thereafter, and in some embodiments, the separated portion of the device layer is bonded, along the cleaved surface, to the patterned low-K dielectric layer.

20 Claims, 5 Drawing Sheets

(56) References Cited

U.S. PATENT DOCUMENTS

| | | | |
|---|---|---|---|
| 2003/0017685 A1* | 1/2003 | Usui | H01L 21/0242 438/483 |
| 2009/0047771 A1* | 2/2009 | Yamazaki | H01L 27/1214 438/458 |
| 2012/0074562 A1* | 3/2012 | Yu | H01L 23/147 257/737 |
| 2012/0307976 A1* | 12/2012 | Kaneko | G21K 1/025 378/62 |
| 2017/0243781 A1* | 8/2017 | Peidous | H01L 21/76251 |

* cited by examiner

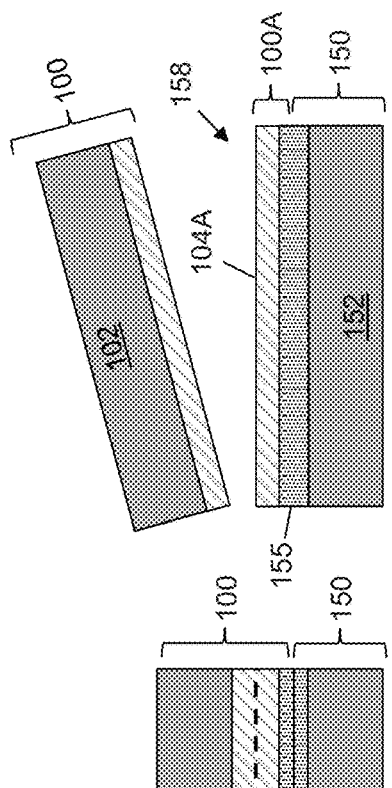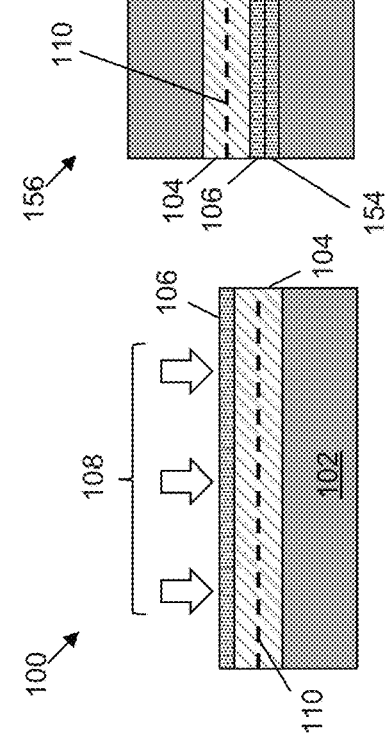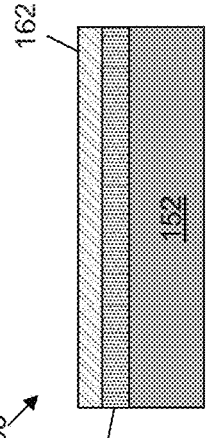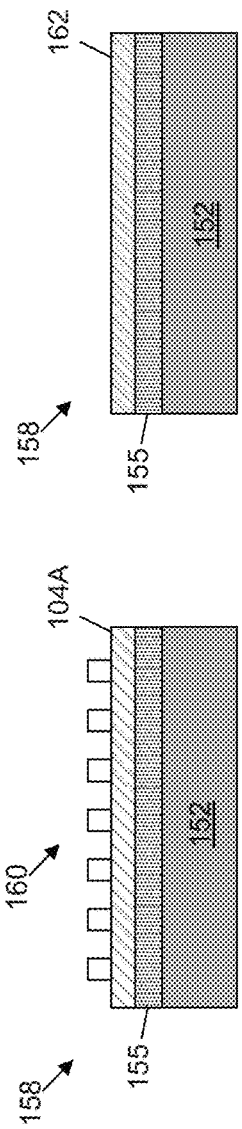

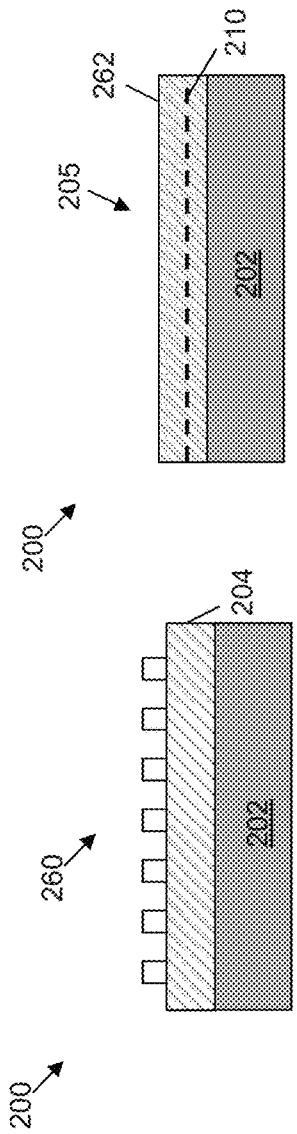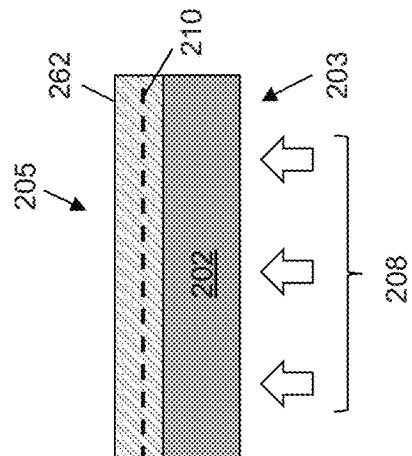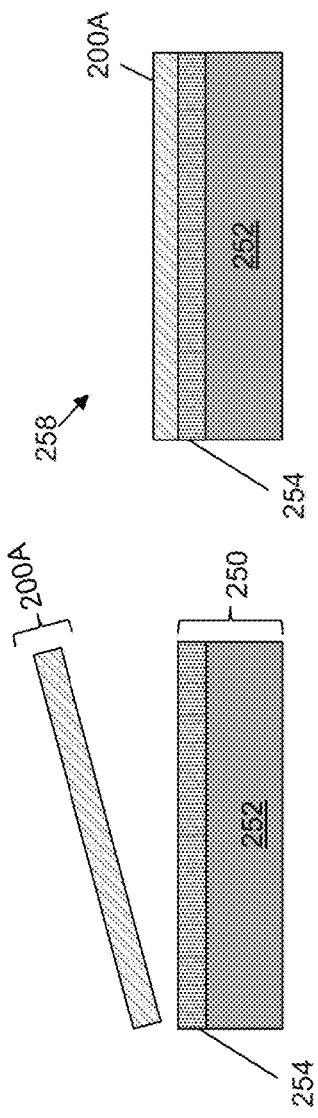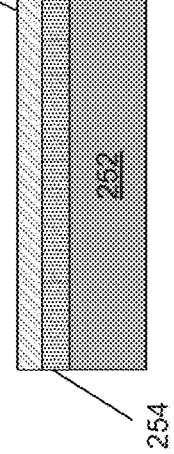

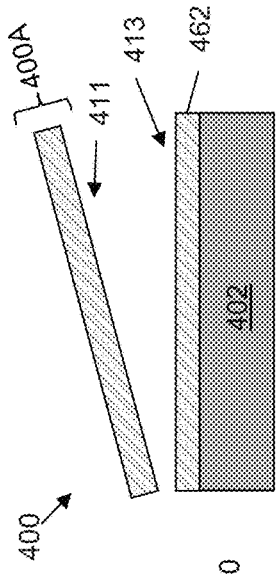
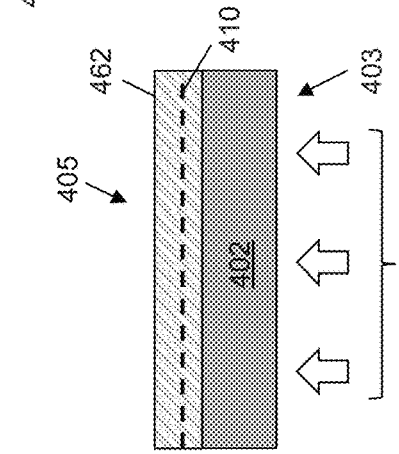
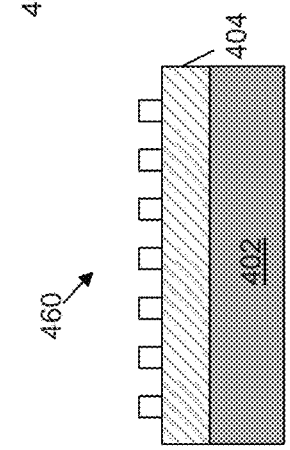
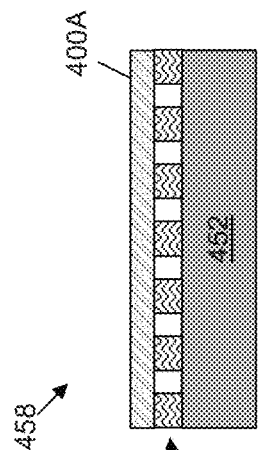
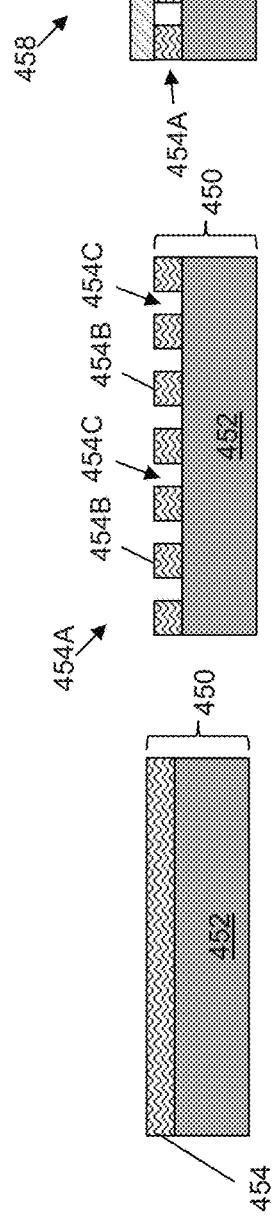
FIG. 4A
FIG. 4B
FIG. 4C
FIG. 4D
FIG. 4E
FIG. 4F

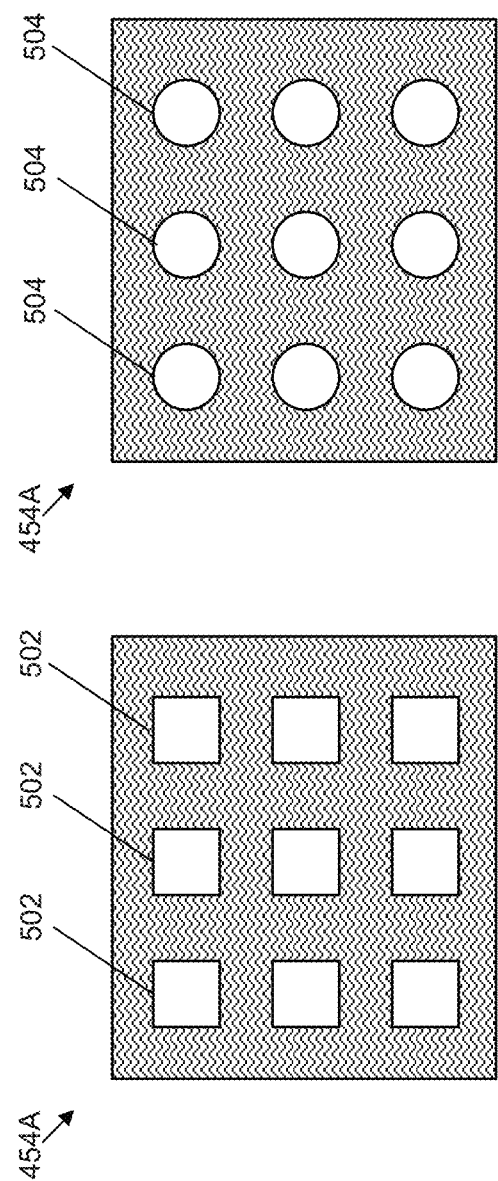

SEMICONDUCTOR STRUCTURE AND RELATED METHOD

CROSS-REFERENCE TO RELATED APPLICATIONS

This application claims the benefit of U.S. Provisional Application No. 62/382,587, filed Sep. 1, 2016, the entirety of which is incorporated by reference herein.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

As one example, silicon-on-insulator (SOI) process technology and devices have been introduced, where a layered silicon-insulator-silicon substrate is used in place of a conventional silicon substrate. By way of example, such a layered substrate may include a surface silicon layer, within which devices (e.g., transistors) are formed, a buried oxide (BOX) layer upon which the surface silicon layer is disposed, and an underlying silicon substrate upon which the BOX layer is disposed. As a result of the layered substrate, SOI-based devices advantageously have reduced parasitic capacitance and RC delay, immunity to device latch-up, and better radiation tolerance, among other advantages. As such, at least some attractive applications of SOI-based devices include high-performance microprocessors and radio-frequency (RF) devices. However, to keep pace with the ever increasing demand for smaller and faster electronic devices which are simultaneously able to support a greater number of increasingly complex and sophisticated functions, existing SOI process technology may no longer be adequate. In particular, at least some existing BOX layers, which are often composed of silicon dioxide or sapphire, may in fact limit the performance of advanced IC devices (e.g., RF devices), for example, at least because of the dielectric constant and RC delay of such materials.

Thus, existing techniques have not proved entirely satisfactory in all respects.

BRIEF DESCRIPTION OF THE DRAWINGS

Aspects of the present disclosure are best understood from the following detailed description when they are read with the accompanying figures. It is noted that, in accordance with the standard practice in the industry, various features are not drawn to scale. In fact, the dimensions of the various features may be arbitrarily increased or reduced for clarity of discussion.

FIGS. 1A-1E is a cross-sectional view of a smart cut first process, according to some embodiments;

FIGS. 2A-2D is a cross-sectional view of a smart cut last process, according to some embodiments;

FIGS. 4A-4F provide cross-sectional views of a device at intermediate stages of fabrication and processed in accordance with the method of FIG. 3; and FIGS. 5A and 5B provide top-views of at least some types of patterns that may be used to pattern the low-K dielectric layer.

DETAILED DESCRIPTION

Figure 3:
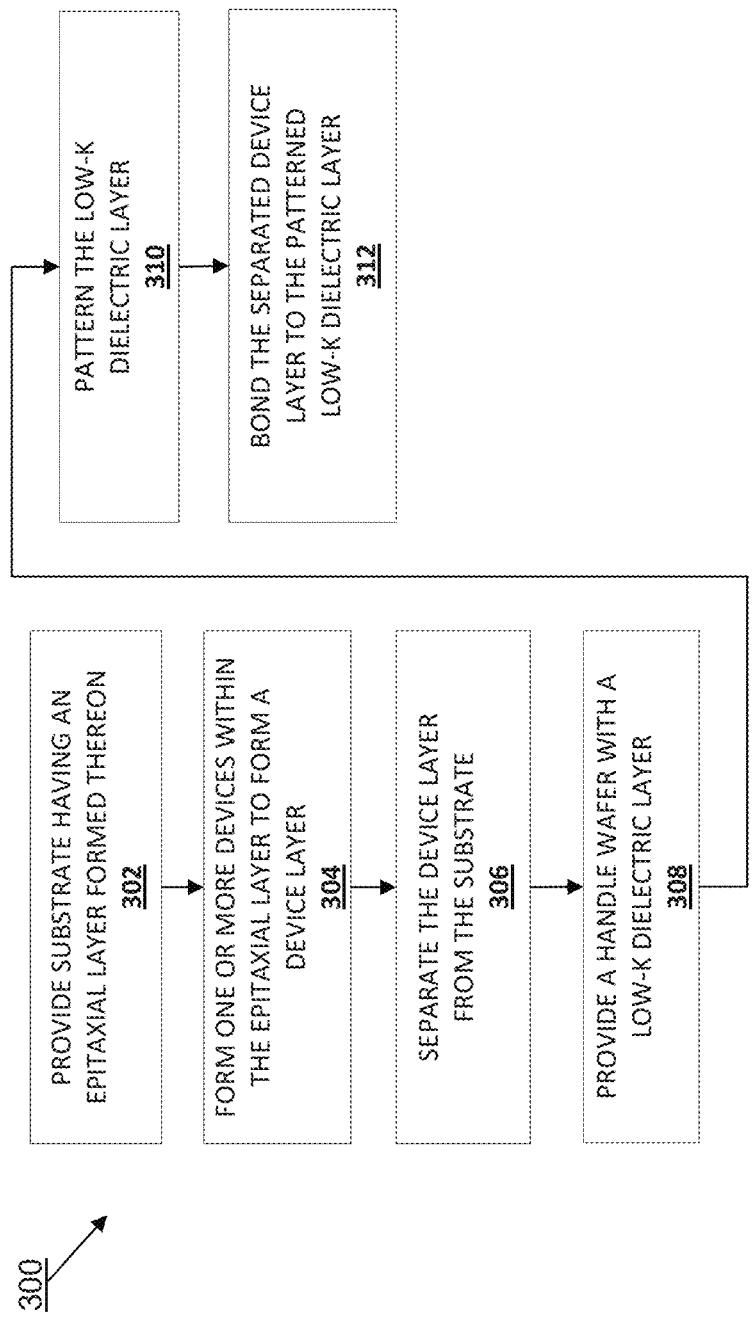
FIG. 3 is a flow chart of a method of fabricating a semiconductor-on-insulator (SCOI) wafer, including a low-K dielectric layer, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of a layered semiconductor-insulator-semiconductor substrate including a surface semiconductor layer, within which devices (e.g., transistors) are formed, a patterned low-K dielectric layer (e.g., rather than a conventional buried oxide layer) upon which the surface semiconductor layer is disposed, and an underlying semiconductor substrate upon which the patterned low-K dielectric layer is disposed. In various examples, the layered semiconductor-insulator-semiconductor substrate may be employed to for the fabrication of planar bulk metal-oxide-semiconductor field-effect transistors (MOSFETs), multi-gate transistors (planar or vertical) such as FinFET devices, gate-all-around (GAA) devices, Omega-gate (Ω-gate) devices, or Pi-gate (Π-gate) devices, as well as strained-semiconductor devices, silicon-on-insulator (SOI) devices, partially-depleted SOI devices, fully-depleted SOI devices, or other devices as known in the art. In addition, embodiments disclosed herein may be employed in the formation of P-type and/or N-type devices. One of ordinary skill may recognize other embodiments of semiconductor devices that may benefit from aspects of the present disclosure.

In particular, the present disclosure is generally related to silicon on insulator (SOI) process technology and devices. SOI technology refers to the use of a layered silicon-insulator-silicon substrate in place of a conventional silicon substrate in semiconductor manufacturing. In at least some examples, a conventional SOI layered substrate may include a surface silicon layer (e.g., including devices such as transistors), a buried oxide (BOX) layer upon which the surface silicon layer is disposed, and an underlying silicon substrate upon which the BOX layer is disposed. SOI-based devices offer a variety of advantages such as reduced parasitic capacitance, immunity to device latch-up, and better radiation tolerance, among other advantages, which contribute to improved device performance. In at least some existing processes, the BOX layer may include silicon dioxide or sapphire, depending on the intended application. In some cases, the surface silicon layer may vary, or an alternative surface layer may be used, also depending on the intended application. Due to their low parasitic capacitance, and corresponding reduced RC delay, at least some attractive applications of SOI-based devices include high-performance microprocessors and radio-frequency (RF) devices. However, to keep pace with the ever increasing demand for smaller and faster electronic devices which are simultaneously able to support a greater number of increasingly complex and sophisticated functions, continued advances in semiconductor manufacturing processes and technology are needed.

By way of example, at least some existing methods include formation of a layered silicon-insulator-silicon substrate, as described above, where a "smart cut" process is used to form an SOI substrate including a BOX layer (e.g., such as an $SiO_2$ BOX layer). With reference to FIGS. 1A-1E, illustrated therein is an example of a conventional smart cut process. As shown in the example of FIG. 1A, a device/donor wafer 100, including a bulk semiconductor wafer 102 (e.g., a silicon wafer) and an epitaxial layer 104, may be oxidized to form an oxide layer 106 on the epitaxial layer 104. In various examples, devices (e.g., such as transistors) may be formed within the epitaxial layer 104 after fabrication of the SOI wafer is complete. Thus, at least some conventional processes may be referred to as "smart cut first" processes. In some cases, a chemical mechanical polishing (CMP) process is performed to the oxide layer 106 in order to thin the oxide. After formation and thinning of the oxide layer 106, an ion implantation process 108, for example using hydrogen, is performed through the thinned oxide and into a first side of the device wafer 100. It is noted that the ion implantation forms defects along a plane 110 (e.g., a defect plane) within the device wafer 100, for example, where the defect plane 110 is substantially parallel to the surface of the wafer. In various examples, the defect plane may be formed within the bulk wafer 102, within the epitaxial layer 104, or at a boundary between the bulk wafer 102 and the epitaxial layer 104. Separately, and with reference to FIG. 1B, a handle wafer 150 including a bulk semiconductor wafer 152 (e.g., a silicon wafer) and an oxide layer 154 formed on the bulk wafer 152 is provided. In some examples, prior to formation of the oxide layer 154, a polysilicon layer may be formed on bulk wafer 152, with the oxide layer 154 formed on the polysilicon layer. In some cases, after formation of the oxide layer 154, a CMP process may be performed to thin the oxide layer 154. Thereafter, surfaces of each of the oxide layer 106 and the oxide layer 154 may be cleaned (e.g., to remove any particles and provide a surface chemistry that is favorable for bonding), and the device wafer 100 is bonded to the handle wafer 150 along the cleaned surfaces of the oxide layer 106 and the oxide layer 154, thereby forming a bonded wafer pair 156. In some examples, the bonded oxide layers 106, 154 (e.g., shown in FIG. 1B) may be equivalently referred to more generally as a bottom oxide (BOX) layer 155 (e.g., shown in FIG. 1C). In the following step, and referring to FIGS. 1B and 1C, the wafer pair 156 is split or cleaved along the defect plane 110 that was previously created by the ion implantation process 108, leaving a portion 100A of the device wafer 100 attached to the handle wafer 150, and splitting off a majority of the device wafer 100. Thus, an SOI wafer 158 is formed. In some examples, the portion 100A of the device wafer 100 includes the oxide layer 106 (FIG. 1B) and a portion 104A of the epitaxial layer 104 (FIG. 1B), in which devices (e.g., transistors) are formed in subsequent processes. In some cases, thermal energy (e.g., heating) is sufficient to induce the splitting or cleaving along the defect plane 110, but mechanical force can be used in some cases instead of, or in conjunction with, heating. After the splitting or cleaving, additional processes may be performed for example to clean, anneal, and smooth the fabricated SOI wafer 158. In various examples, the device wafer 100, after having the portion 100A split off, may be repolished and used to make another SOI wafer.

In at least some conventional processes, devices (e.g., transistors) may be formed within the SOI wafer 158 after fabrication of the SOI wafer 158 (e.g., by the smart cut process described above). As merely one example, FIG. 1D illustrates one of a plurality of process steps that may be performed during the fabrication of devices within the SOI wafer 158 (e.g., within the epitaxial layer portion 104A), and FIG. 1E illustrates the SOI wafer 158 including a device layer 162, where the device layer 162 may include any of a plurality of devices, interconnects, or other such features formed within the SOI wafer 158 (e.g., within the epitaxial layer portion 104A) during the fabrication process. As part of the fabrication process, and with reference to the example of FIG. 1D, a patterned layer 160 may need to be accurately aligned to one or more features within the epitaxial layer portion 104A, for instance, during a photolithography step, a layer deposition step, an etching step, or other semiconductor processing step. In particular, and in order for proper functionality and reliability of the as-fabricated devices, there should be excellent overlay control in such alignment processes. As used herein, the term "overlay control" is used to define the control of pattern-to-pattern alignment and/or layer-to-layer alignment. In general, overlay control has become more and more critical due to the increasing pattern densities and pattern complexities, as well as due to the increasingly advanced and complex semiconductor processing techniques (e.g., such as advanced photolithography techniques, among others). However, in smart cut first processes (e.g., described with reference to FIGS. 1A-1E) where there are different coefficients of thermal expansion between the silicon surface layer (e.g., the epitaxial layer portion 104A) and the underlying BOX layer (e.g., the BOX layer 155), thermal processes performed during device (e.g., transistor) fabrication may lead to undesirable warpage of the SOI wafer 158, thereby degrading overlay accuracy, as well as device functionality and reliability (e.g., of devices in the device layer 162).

In an effort to prevent such undesirable warpage, a "smart cut last" process was introduced and is described in more detail in U.S. patent application Ser. No. 14/857,435, entitled "SEMICONDUCTOR STRUCTURE AND METHOD FOR MANUFACTURING THE SAME", filed Sep. 17, 2015, the entire disclosure of which is incorporated herein by reference. In the smart cut last process, an SOI structure (e.g., similar to the SOI wafer 158) is formed after device (e.g., transistor) formation, thereby mitigating exposure of the SOI wafer to the thermal processes used during device formation and avoiding the undesired warpage. With reference to FIGS. 2A-2D, illustrated therein is an example of a smart cut last process. Some aspects of the described smart cut last process may be similar to processes described above and are therefore described briefly for clarity of discussion. As shown in the example of FIG. 2A, a device wafer 200 including a bulk semiconductor wafer 202 (e.g., a silicon wafer) and an epitaxial layer 204 are provided. In some embodiments, the wafer 202 and the epitaxial layer 204 may be substantially similar to the wafer 102 and the epitaxial layer 104 discussed above.

With reference to the example of FIG. 2A, illustrated therein is one of a plurality of process steps that may be performed during the fabrication of devices within the epitaxial layer 204 of the device wafer 200, and FIG. 2B illustrates the device wafer 200 including a device layer 262, where the device layer 262 may include any of a plurality of devices, interconnects, or other such features formed within the epitaxial layer 204 of the device wafer 200. As part of the fabrication process, and with reference to the example of FIG. 2A, a patterned layer 260 may need to be accurately aligned to one or more features within the epitaxial layer 204, for instance, during a photolithography step, a layer deposition step, an etching step, or other semiconductor processing step. In addition, thermal processes may be performed during fabrication of devices within the epitaxial layer 204. In the smart cut first process, described above, different coefficients of thermal expansion between the silicon surface layer (e.g., the epitaxial layer portion 104A) and the underlying BOX layer (e.g., the BOX layer 155) may lead to undesirable warpage of the SOI wafer 158 during such thermal processes. In the smart cut last process, by contrast, a difference in the coefficient of thermal expansion between the epitaxial layer 204 and the underlying wafer 202 may be low. For example, the epitaxial layer 204 may be formed on the wafer 202 without an interposing dielectric layer (e.g., such as a BOX layer). As such, the difference between the coefficient of thermal expansion between the adjacent layers (e.g., the epitaxial layer 204 and the wafer 202) may be lowered. As a result, the undesirable warpage, observed in the smart cut first process, may be alleviated in the smart cut last process (e.g., for thermal processes performed during fabrication of devices within the epitaxial layer 204) and excellent overlay control may be maintained.

After fabrication of the device layer 262, including fabrication of devices therein, an ion implantation process 208, for example using hydrogen, is performed into a back side 203 of the device wafer 200. By way of example, the ion implantation process 208 may be performed into the back side 203, opposite a top surface 205 of the device wafer 200, in order to avoid damaging the previously fabricated device layer 262. It is noted that the ion implantation process 208 forms defects along a plane 210 (e.g., a defect plane) within the device wafer 200, for example, where the defect plane 210 is substantially parallel to a surface (e.g., the top surface 205) of the device wafer 200. In various examples, the defect plane 210 may be formed within the bulk wafer 202, within the epitaxial layer 204, or at a boundary between the bulk wafer 202 and the epitaxial layer 204.

Referring to FIGS. 2B and 2C, the device wafer 200 is split or cleaved along the defect plane 210 that was previously created by the ion implantation process 208, separating a portion 200A of the device wafer 200, where the separated portion 200A includes at least a portion of the device layer 262 in which devices (e.g., transistors), interconnects, and/or other structures were previously fabricated. In some cases, thermal energy (e.g., heating) is sufficient to induce the splitting or cleaving along the defect plane 210, but mechanical force can be used in some cases instead of, or in conjunction with, heating. Separately, and with reference to FIG. 2C, a handle wafer 250 including a bulk semiconductor wafer 252 (e.g., a silicon wafer) and an oxide layer 254 formed on the bulk wafer 252 is provided. In some cases, surfaces of each of the separated portion 200A and the oxide layer 254 may be cleaned (e.g., to remove any particles and provide a surface chemistry that is favorable for bonding), and the separated portion 200A is bonded to the handle wafer 250 along the cleaned surfaces of the separated portion 200A and the oxide layer 254, thereby forming an SOI device wafer 258 (e.g., shown in FIG. 2D). Thus, in some examples, the SOI device wafer 258 may include the separated portion 200A (e.g., including previously fabricated devices), where the separated portion is disposed on an oxide layer (e.g., the oxide layer 254), and where the oxide layer is disposed on the wafer 252. In some embodiments, the oxide layer of the SOI device wafer 258 may be equivalently referred to as a BOX layer.

Whether using the smart cut first or the smart cut last process for the formation of an SOI wafer, existing processes often use $SiO_2$ as the buried oxide (BOX) layer which underlies the surface silicon layer, within which devices (e.g., transistors) are formed. In other words, it may be said that at least some existing processes use an oxide bonding process for SOI wafer formation. As previously stated, the continued advances in electronic devices (e.g., high-performance RF devices) likewise require continued advances in semiconductor manufacturing processes and technology. For instance, using $SiO_2$ as the buried oxide (BOX) layer may no longer be adequate, as advanced high-performance devices (e.g., RF devices disposed within a surface silicon layer) may in fact be limited by the dielectric constant and RC delay of the underlying $SiO_2$. Thus, there is a need for a $SiO_2$ BOX replacement that has a lower dielectric constant than $SiO_2$ and which has good bonding properties.

Embodiments of the present disclosure offer advantages over the existing art, though it is understood that other embodiments may offer different advantages, not all advantages are necessarily discussed herein, and no particular advantage is required for all embodiments. For example, embodiments of the present disclosure are directed to a method of forming a semiconductor-on-insulator (SCOI) wafer (e.g., which may utilize silicon to form a silicon-on-insulator wafer or other type of semiconductor to form another type of semiconductor-on-insulator wafer). In particular, embodiments of the present disclosure provide a low-K dielectric layer, for example, to replace the conventional $SiO_2$ BOX layer. In some examples, the low-K dielectric layer includes a patterned low-K dielectric layer, as discussed below. In some embodiments, the low-K dielectric layer may include benzocyclobutene (BCB), benzocyclobutadiene, air, a combination thereof, or other suitable low-K material. Embodiments disclosed herein thus provide a low-K dielectric layer having a dielectric constant lower than that of $SiO_2$. For example, $SiO_2$ has a dielectric constant of around 3.9, BCB has a dielectric constant of around 2.65, and air has a dielectric constant of around 1. As a result of the lower dielectric constant and RC delay of the low-K dielectric layer, embodiments disclosed herein provide for superior performance of devices within a semiconductor layer overlying the low-K dielectric layer.

Referring now to FIG. 3, illustrated is a flow chart of a method 300 of fabricating a semiconductor-on-insulator (SCOI) wafer, including a low-K dielectric layer, according to one or more aspects of the present disclosure. In various embodiments, at least some aspects of the method 300 may be used to fabricate the SOI wafer 158 or the SOI wafer 258, described above with reference to FIGS. 1A-1E and FIGS. 2A-2D, respectively. Thus, one or more aspects discussed above with reference to the SOI wafer 158 or the SOI wafer 258 may also apply to the method 300. As such, some details have been omitted for clarity of discussion. Stated another way, some aspects of the smart cut last process, as described in U.S. patent application Ser. No. 14/857,435, are also employed in the present disclosure. Moreover, aspects of the present disclosure may equally be applied to a smart cut first process, such as described above. Additionally, FIGS. 4A-4F are cross sectional views of embodiments of the fabrication of an SOI wafer 400 according to one or more aspects of the present disclosure and corresponding to one or more steps of the method 300 of FIG. 3.

Referring now to the method 300, the method 300 begins at block 302 where a substrate, having an epitaxial layer thereon, is provided. Referring to the example of FIG. 4A, and in an embodiment of block 302, a device wafer 400 including a substrate 402 is provided. In some embodiments, the substrate 402 may be substantially similar to the substrate 202 discussed above with reference to FIG. 2A. In various embodiments, the substrate 402 may be a silicon-containing substrate. For example, the substrate 402 may include, but is not limited to, silicon (Si), silicon germanium (SiGe), silicon carbide (SiC), silicon germanium carbide (SiGeC), Si/Si, Si/SiC, or Si/SiGeC. Still referring to the example of FIG. 4A, and in a further embodiment of block 302, an epitaxial layer 404 (e.g., an epitaxial semiconductor layer) is formed on the substrate 402. In some embodiments, the epitaxial layer 404 may be referred to as a device layer, for example, upon formation of one or more devices, interconnects, and/or other features within the epitaxial layer 404. In some examples, the epitaxial layer 404 and the substrate 402 may cooperatively form a first wafer or a device wafer. In various embodiments, the epitaxial layer 404 may include the same material as the substrate 402 or a different material than the substrate 402. In various examples, the epitaxial layer 404 may include, but is not limited to, silicon (Si), silicon germanium (SiGe), silicon carbide (SiC), silicon germanium carbide (SiGeC), Si/Si, Si/SiC, and Si/SiGeC.

The method 300 then proceeds to block 304 where one or more devices are formed within the epitaxial layer to form a device layer. Referring to the example of FIGS. 4A and 4B, and in an embodiment of block 304, one or more devices (e.g., transistors) may be formed within and/or on a surface of the epitaxial layer 404, resulting in a device layer 462. As part of the fabrication process, a patterned layer 460 may need to be accurately aligned to one or more features within the epitaxial layer 404, for instance, during a photolithography step, a layer deposition step, an etching step, or other semiconductor processing step. It is noted that at least one thermal process may be performed during the formation of the one or more devices. However, in various embodiments, the epitaxial layer 404 and the substrate 402 may have the same, similar, or small differences in their coefficients of thermal expansion, thereby avoiding the undesirable warpage discussed above. This is an advantage of using the smart cut last process, as previously described.

The method 300 then proceeds to block 306 where the device layer is separated from the substrate. Referring to the example of FIGS. 4B and 4C, and in an embodiment of block 306, at least a portion of the device layer 462 is separated from the device wafer 400. For example, after formation of the device layer 462, at least a portion of the device layer 462, including the one or more devices, interconnects, and/or other features formed therein, is separated from the device wafer 400. Such a separation process may be accomplished in substantially the same manner as described above. For example, an ion implantation process 408 is performed into a backside 403 of the device wafer 400 to form a defect plane 410. In some embodiments, the ion implantation process 410 implants hydrogen and/or helium. By way of example, the ion implantation process 408 is performed into the back side 403, opposite a top surface 405 of the device wafer 400, in order to avoid damaging the previously fabricated device layer 462. It is noted that the ion implantation process 408 forms defects along a plane 410 (e.g., a defect plane) within the device wafer 400, for example, where the defect plane 410 is substantially parallel to a surface (e.g., the top surface 405) of the device wafer 400. In various examples, the defect plane 410 may be formed within the substrate 402, within the device layer 462, or at a boundary between the substrate 402 and the device layer 462. After forming the defect plane 410, the device wafer 400 is split or cleaved along the defect plane 410, thereby separating a portion 400A of the device wafer 400, resulting in a cleaved surface 411 on the portion 400A and a cleaved surface 413 on the remaining bulk device wafer 400. In various embodiments, the separated portion 400A includes at least a portion of the device layer 462 in which devices (e.g., transistors), interconnects, and/or other structures were previously fabricated. In some cases, thermal energy (e.g., heating) is sufficient to induce the splitting or cleaving along the defect plane 410, but mechanical force can be used in some cases instead of, or in conjunction with, heating.

The method 300 then proceeds to block 308 where a handle wafer including a low-K dielectric layer is provided. Referring to the example of FIG. 4D, and in an embodiment of block 308, a handle wafer 450 including a bulk semiconductor substrate 452 and a low-K dielectric layer 454 is separately provided. In various embodiments, the substrate 452 may be a silicon-containing substrate. For example, the substrate 452 may include, but is not limited to, silicon (Si), silicon germanium (SiGe), silicon carbide (SiC), silicon germanium carbide (SiGeC), Si/Si, Si/SiC, or Si/SiGeC. In some embodiments, the low-K dielectric layer 454 is deposited on the substrate 452, for example, by spin-coating, ALD, CVD, or other appropriate method. In various examples, the low-K dielectric layer 454 may include benzocyclobutene (BCB), benzocyclobutadiene, air (e.g., when the low-K dielectric layer 454 is patterned), a combination thereof, or other suitable low-K material. As discussed above, the low-K dielectric layer 454 has a dielectric constant lower than that of $SiO_2$. For example, $SiO_2$ has a dielectric constant of around 3.9, BCB has a dielectric constant of around 2.65, and air has a dielectric constant of around 1. As a result of the lower dielectric constant and RC delay of the low-K dielectric layer 454, devices formed within the separated portion 400A will exhibit superior performance, for example, when the separated portion 400A is subsequently bonded to the low-K dielectric layer 454. In some embodiments, an adhesion promoter may be deposited over the substrate 452 prior to formation of the low-K dielectric layer 454.

The method 300 then proceeds to block 310 where the low-K dielectric layer is patterned. Referring to the example of FIGS. 4D and 4E, and in an embodiment of block 310, after the low-K dielectric layer 454 is formed over the substrate 452, the low-K dielectric layer 454 may be patterned to form a patterned low-K dielectric layer 454A. In various examples, the low-K dielectric layer 454 may be patterned using photolithography, etching, developing, etc., to include any of a plurality of patterns such as window patterns, crosshatch patterns, fence patterns, diagonal patterns, checker patterns, triangular patterns, diamond patterns, square patterns, rectangular patterns, circular patterns, oval patterns, pentagonal patterns, hexagonal patterns, or any other appropriate pattern. In some embodiments, the BCB layer or benzocyclobutadiene layer may include a photosensitive material. In some cases, the photosensitive material includes a photosensitive resin. Thus, in some examples, patterning of the BCB layer or benzocyclobutadiene layer may be accomplished by one or more lithographic processes (e.g., exposure and development). Depending on the material used for the low-K dielectric layer, and in various embodiments, a variety of patterning processes may be used. Merely for purposes of illustration, FIGS. 5A and 5B show top-views of two types of patterns that may be used to form the patterned low-K dielectric layer 454A. For example, FIG. 5A shows the patterned low-K dielectric layer 454A including a plurality of square patterns 502, and FIG. 5B shows the patterned low-K dielectric layer 454A including a plurality of circular patterns 504. For avoidance of doubt, and as described herein, "patterning" of the low-K dielectric layer is used to describe removal of a portion of the low-K dielectric layer, resulting in air gaps that expose the underlying second semiconductor substrate, while other portions of the low-K dielectric layer remain on the surface of the second semiconductor substrate. Thus, the patterned low-K dielectric layer may include a mix of the low-K dielectric material and air (e.g., by way of the air gaps). For example, with reference to FIG. 4E, the patterned low-K dielectric layer 454A includes a plurality of low-K dielectric layer portions 454B and a plurality of air gaps 454C interposing the plurality of low-K dielectric layer portions 454B. Thus, by patterning the low-K dielectric layer 454 and introducing the air gaps (e.g., with a dielectric constant of around 1), the dielectric constant of the low-K dielectric layer 454 is further reduced. The further reduced dielectric constant will improve the performance of devices within the separated portion 400A, for example, when the separated portion 400A is subsequently bonded to the patterned low-K dielectric layer 454A.

Regardless of the specific type of pattern used to form the patterned low-K dielectric layer 454A, an amount of the low-K dielectric layer that remains on the surface of the substrate 452 after patterning of the low-K dielectric layer (e.g., the plurality of low-K dielectric layer portions 454B) may be equal or greater than about 50%. Stated another way, a first surface area (e.g., surface of the substrate 452) covered by the patterned low-K dielectric layer 454A (e.g., the plurality of low-K dielectric layer portions 454B) may be equal to or greater than about 50%, while a second surface area (e.g., surface of the substrate 452) covered by the air gaps (e.g., the plurality of air gaps 454C) may be less than about 50%. To be sure, in some cases, other amounts (e.g., other percentages) of the low-K dielectric layer that remains on the surface of the substrate 454 after patterning of the low-K dielectric layer may equivalently be used without departing from the scope of this disclosure. By way of example, the amount of the low-K dielectric layer that remains on the surface of the substrate 452 after patterning of the low-K dielectric layer is selected so as to ensure proper bonding and/or adhesion of the subsequently attached separated portion 400A, which includes one or more devices, as described above.

The method 300 then proceeds to block 312 where the separated device layer is bonded to the patterned low-K dielectric layer. Referring to the example of FIG. 4F, and in an embodiment of block 312, after formation of the patterned low-K dielectric layer 454A on the substrate 452, the separated portion 400A (e.g., including at least a portion of the device layer 462 in which devices, interconnects, and/or other structures) is bonded to the patterned low-K dielectric layer 454A. In various examples, the bonding may be accomplished by one or more of a plasma activation (e.g., $O_3$ plasma), a low temperature bonding anneal, by use of an adhesive layer, by thermocompressive bonding, or by other suitable bonding process. As a result of the bonding process, the separated portion 400A (e.g., including at least a portion of the device layer 462), the patterned low-K dielectric layer 454A, and the substrate 452 form an SOI device wafer 458. Stated another way, the patterned low-K dielectric layer 454A is disposed on the substrate 452, and the separated portion 400A is disposed on the patterned low-K dielectric layer 454A. In some embodiments, the patterned low-K dielectric layer 454A is bonded to the cleaved surface 411 of the separated portion 400A, formed at the defect plane 410 (FIG. 4B), as described above and away from the one or more devices which may be formed on an opposite side of the separated portion 400A. Thus, patterned low-K dielectric layer 454A is buried beneath the device layer (e.g., the separated portion 400A) after the device layer is bonded to the patterned low-K dielectric layer 454A. As such, the patterned low-K dielectric layer 454A is effectively used as a buried dielectric layer, replacing the conventional BOX layer (e.g., $SiO_2$), as discussed above. Moreover, by way of the patterning of the low-K dielectric layer, as described above, the low-K dielectric layer may include a combination of low-K dielectric material (e.g., BCB, benzocyclobutadiene) and air (e.g., by way of the air gaps), further reducing the effective dielectric constant of the low-K dielectric layer. As such, the parasitic capacitance is also further reduced. To be sure, in at least some embodiments, the buried low-K dielectric layer may not be patterned, but may instead include a solid low-K dielectric layer (e.g., as shown in FIG. 4D). Even in examples where the low-K dielectric layer is not patterned, devices formed in an overlying device layer (e.g., the separated portion 400A) may exhibit improved performance, as the low-K dielectric layer materials disclosed herein (e.g., BCB) have a dielectric constant lower than that of $SiO_2$.

In some embodiments, the SOI device wafer 458 may undergo further processing to form various features and regions known in the art. Moreover, additional process steps may be implemented before, during, and/or after the method 300. Also, in some embodiments of the method 300, some process steps described above may be replaced or eliminated.

The various embodiments described herein offer several advantages over the existing art. It will be understood that not all advantages have been necessarily discussed herein, no particular advantage is required for all embodiments, and other embodiments may offer different advantages. As one example, embodiments discussed herein include methods and structures for providing a semiconductor-on-insulator (SCOI) wafer where a low-K dielectric layer is used to replace the conventional $SiO_2$ BOX layer. In some examples, the low-K dielectric layer includes a patterned low-K dielectric layer. In some embodiments, the low-K dielectric layer may include benzocyclobutene (BCB), benzocyclobutadiene, air, a combination thereof, or other suitable low-K material. Embodiments disclosed herein thus provide a low-K dielectric layer having a dielectric constant lower than that of $SiO_2$. As a result of the lower dielectric constant and RC delay of the low-K dielectric layer, embodiments disclosed herein provide for superior performance of devices within a semiconductor layer overlying the low-K dielectric layer.

Thus, one of the embodiments of the present disclosure described a method including forming a device layer on a first semiconductor substrate. In various embodiments, at least a portion of the device layer is separated from the first semiconductor substrate, where the separating forms a cleaved surface on the separated portion of the device layer. In some examples, a patterned low-K dielectric layer is formed on a second semiconductor substrate. Thereafter, and in some embodiments, the separated portion of the device layer is bonded, along the cleaved surface, to the patterned low-K dielectric layer.

In another of the embodiments, discussed is a method where a low-K dielectric layer is formed on a handle wafer. In some embodiments, a lithographic process is performed to pattern the low-K dielectric layer, thereby forming a patterned low-K dielectric layer. In various examples, an epitaxial layer is then bonded to the patterned low-K dielectric layer, where the epitaxial layer includes a plurality of devices formed therein.

In yet another of the embodiments, discussed is a semiconductor structure including a semiconductor substrate, a patterned dielectric layer disposed on the semiconductor substrate, a semiconductor layer disposed on the patterned dielectric layer, and at least one device disposed on the second surface of the semiconductor layer. In some embodiments, the semiconductor layer has opposing first and second surfaces, the first surface being located between the second surface and the patterned dielectric layer, and the first surface being rougher than the second surface (e.g., due to a cleaving/separating process).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a device layer on a first semiconductor substrate;
   separating at least a portion of the device layer from the first semiconductor substrate, wherein the separating forms a cleaved surface on the separated portion of the device layer;
   forming a patterned low-K dielectric layer on a second semiconductor substrate, wherein the patterned low k dielectric layer includes a combination of a low-K dielectric material and a plurality of air gaps; and
   bonding the separated portion of the device layer, along the cleaved surface, to the patterned low-K dielectric layer.

2. The method of claim 1, wherein the separating the device layer further comprises:
   forming, by way of an ion implantation process, a defect plane that is substantially parallel to a top surface of the device layer; and
   performing an anneal process to separate at least the portion of the device layer from the semiconductor substrate along the defect plane.

3. The method of claim 2, wherein the ion implantation process is performed into a back surface of the first semiconductor substrate, and wherein the back surface of the first semiconductor substrate is opposite the top surface of the device layer.

4. The method of claim 1, wherein the low k dielectric material includes a material selected from the group consisting of benzocyclobutene (BCB) and benzocyclobutadiene.

5. The method of claim 1, wherein the forming the patterned low-K dielectric layer includes removing first portions of a low-K dielectric material layer while second portions of the low-K dielectric material layer remain on a top surface of the second semiconductor substrate, and wherein the second portions of the low-K dielectric material layer that remain cover an amount equal to or greater than about 50% of the top surface of the second semiconductor substrate.

6. The method of claim 1, wherein the forming the patterned low-K dielectric layer on the second semiconductor substrate further includes:
   spin-coating one of a benzocyclobutene (BCB) layer and a benzocyclobutadiene layer on the second semiconductor substrate;
   exposing portions of the one of the BCB layer and the benzocyclobutadiene layer by a photolithography process; and
   removing one of the exposed portions, or unexposed portions, of the one of the BCB layer and the benzocyclobutadiene layer by a development process, thereby forming the patterned low-K dielectric layer.

7. A method, comprising:
   forming a low-K dielectric layer on a handle wafer, wherein a first dielectric constant of the low-K dielectric layer is less than that of $SiO_2$;
   performing a lithographic process to pattern the low-K dielectric layer, thereby forming a patterned low-K dielectric layer, wherein a second dielectric constant of the patterned low-K dielectric layer is less than the first dielectric constant; and
   bonding an epitaxial layer to the patterned low-K dielectric layer, wherein the epitaxial layer includes a plurality of devices formed therein.

8. The method of claim 7, wherein the low-K dielectric layer includes a photosensitive layer.

9. The method of claim 7, further comprising:
   prior to forming the low-K dielectric layer, depositing an adhesion promoter on the handle wafer; and
   forming the low-K dielectric layer on the adhesion promoter.

10. The method of claim 7, wherein the forming the patterned low-K dielectric layer includes forming the patterned low-K dielectric layer having a plurality of low-K dielectric layer portions and a plurality of air gaps interposing the plurality of low-K dielectric layer portions.

11. The method of claim 7, wherein the bonding the epitaxial layer to the patterned low-K dielectric layer further comprises at least one of performing a plasma activation bonding process, performing a low temperature bonding anneal, using an adhesive layer, and performing a thermo-compressive bonding process.

12. The method of claim 7, further comprising:
forming the epitaxial layer on a device wafer;
separating the epitaxial layer from the device wafer, wherein the separating forms a cleaved surface on the separated epitaxial layer; and
bonding the separated epitaxial layer, along the cleaved surface, to the patterned low-K dielectric layer.

13. A semiconductor structure, comprising:
a semiconductor substrate;
a patterned dielectric layer disposed on the semiconductor substrate, wherein the patterned dielectric layer includes a combination of a low-K dielectric material and a plurality of air gaps;
a semiconductor layer disposed on the patterned dielectric layer, wherein the semiconductor layer has opposing first and second surfaces, the first surface being located between the second surface and the patterned dielectric layer; and
at least one device disposed on the second surface of the semiconductor layer.

14. The semiconductor structure of claim 13, wherein the semiconductor layer includes an epitaxial semiconductor layer, and wherein the patterned dielectric layer includes a patterned low-K dielectric layer.

15. The semiconductor structure of claim 14, wherein the patterned low-K dielectric layer includes benzocyclobutene (BCB).

16. The semiconductor structure of claim 13, wherein a first dielectric constant of the low-K dielectric material is less than that of $SiO_2$, and wherein a second dielectric constant of the combination of the low-K dielectric material and the plurality of air gaps is less than a first dielectric constant.

17. The semiconductor structure of claim 13, wherein the low-K dielectric material of the patterned dielectric layer covers an amount equal to or greater than about 50% of a top surface of the semiconductor substrate.

18. The semiconductor structure of claim 13 wherein the at least one device includes a radio frequency (RF) device.

19. The semiconductor structure of claim 13, wherein the patterned low-K dielectric layer includes benzocyclobutadiene.

20. The method of claim 7, wherein performing the lithographic process to pattern the low-K dielectric layer includes removing a portion of the low-K dielectric layer to expose a portion of the handle wafer.

* * * * *